(12) United States Patent
Yang et al.

(10) Patent No.: US 9,295,133 B2
(45) Date of Patent: Mar. 22, 2016

(54) SOLUTION PROCESSABLE MATERIAL FOR ELECTRONIC AND ELECTRO-OPTIC APPLICATIONS

(75) Inventors: Yang Yang, Los Angeles, CA (US); Mi-Haye Park, Los Angeles, CA (US); Gang Li, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 1618 days.

(21) Appl. No.: 12/175,261

(22) Filed: Jul. 17, 2008

(65) Prior Publication Data

US 2010/0012178 A1    Jan. 21, 2010

(51) Int. Cl.
| | | |
|---|---|---|
| H01L 31/00 | (2006.01) | |
| H05B 33/26 | (2006.01) | |
| B82Y 10/00 | (2011.01) | |
| H01B 1/08 | (2006.01) | |
| H01L 51/42 | (2006.01) | |
| H01L 51/00 | (2006.01) | |

(52) U.S. Cl.
CPC ............... *H05B 33/26* (2013.01); *B82Y 10/00* (2013.01); *H01B 1/08* (2013.01); *H01L 51/4253* (2013.01); *H01L 51/0036* (2013.01); *H01L 51/0038* (2013.01); *H01L 51/0047* (2013.01); *Y02E 10/549* (2013.01)

(58) Field of Classification Search
None
See application file for complete search history.

(56) References Cited

U.S. PATENT DOCUMENTS

| | | | | |
|---|---|---|---|---|
| 3,494,842 | A * | 2/1970 | De Respiris | 205/464 |
| 2004/0120884 | A1 * | 6/2004 | Sherman | 423/608 |
| 2004/0239239 | A1 | 12/2004 | Fukase | |
| 2007/0062577 | A1 * | 3/2007 | Koppe | 136/263 |
| 2007/0194467 | A1 * | 8/2007 | Yang et al. | 257/E23.155 |
| 2008/0032221 | A1 * | 2/2008 | Lin et al. | 430/58.65 |
| 2008/0041447 | A1 * | 2/2008 | Tseng et al. | 136/263 |
| 2008/0087867 | A1 * | 4/2008 | Haramoto | 252/500 |
| 2009/0229667 | A1 * | 9/2009 | Shrotriya et al. | 136/263 |
| 2010/0096004 | A1 * | 4/2010 | Hu et al. | 136/256 |
| 2010/0132782 | A1 * | 6/2010 | Laird et al. | 136/256 |

FOREIGN PATENT DOCUMENTS

CN    1551696 A    12/2004

OTHER PUBLICATIONS

Dictionary.com, definition of "Blend," Retrieved Sep. 25, 2012.*
Tang, C. W.; VanSlyke, S. A. *Appl. Phys. Lett.* 1987, 51, 913.
Tang, C. W. *Appl. Phys. Lett.* 1986, 48, 183.
Bao, Z.; Lovinger, A. J.; Dodabalapur, A. *Appl. Phys. Lett.* 1996, 69, 3066.
Ma, L. P.; Liu, J.; Yang, Y. *Appl. Phys. Lett.* 2002, 80, 2997.
(Continued)

*Primary Examiner* — Jennifer Michener
*Assistant Examiner* — Magali P Slawski
(74) *Attorney, Agent, or Firm* — Venable LLP; Henry J. Daley

(57) ABSTRACT

An electro-optic device has a first electrode, a second electrode spaced apart from the first electrode, an active layer disposed between the first electrode and the second electrode, and an interfacial layer in contact with the active layer. The interfacial layer is a blend of a metal oxide and a second material that at least one of reduces a work function or increases an electrical conductivity of the interfacial layer according to an embodiment of this invention. A composition for electro-optic devices is a blend of at least one metal oxide and at least one salt in a ratio, by volume, of at least 1:0.1 and less than 1:1.2.

24 Claims, 11 Drawing Sheets

| device | $V_{oc}$ (V) | $J_{sc}$ (mA/cm$^2$) | PCE (%) | FF(%) |
|---|---|---|---|---|
| /ITO/PEDOT/PP/Al | 0.42 | 9.64 | 2.0 | 48 |
| /ITO/PEDOT/PP/Cs$_2$CO$_3$/Al | 0.36 | 5.34 | 0.7 | 37 |
| /ITO/PEDOT/PP/TiO$_2$/Al | 0.46 | 10.48 | 2.4 | 50 |
| /ITO/PEDOT/PP/TiO$_2$:Cs$_2$CO$_3$/Al | 0.58 | 10.76 | 4.2 | 67 |

(56) References Cited

OTHER PUBLICATIONS

Forrest, S. R. *Nature* 2004, 428, 911.
Hung, L. S.; Tang, C. W.; Mason, M. G. *Appl. Phys. Lett.* 1997, 70, 152.
Grozea, D.; Turak, A.; Feng, X. D.; Lu, Z. H.; Johnson, D.; Wood, R. *Appl. Phys. Lett.* 2002, 81, 3173.
Kin, Z.; Hino, Y.; Kajii, H.; Ohmori, Y. *Mol. Cryst. Liq. Cryst.*, 2007, 462, 225.
Yang, Y.; Heeger, A. J. *Appl. Phys. Lett.* 1994, 64, 1245.
Jonas, F.; Krafft, W.; Muys, B. *Macromol. Symp.* 1995, 100.
Kim, J. Y.; Kim, S. H.; Lee, H. -H.; Lee, K.; Ma, W.; Gong, X.; Heeger, A. J. *Adv. Mater.* 2006, 18, 572.
Hayakawa, A.; Yoshikawa, O.; Fujieda, T.; Uehara, K.; Yoshikawa, S. *Appl. Phys. Lett.* 2007, 90.
Chu, C. -W.; Chen, C. -W.; Li, S. -H.; Wu, E. H. -E.; Yang, Y. *Appl. Phys. Lett.* 2005, 86, 253503.
Li, G.; Shrotriya, V.; Huang, J.; Yao, Y.; Moriarty, T.; Emery, K.; Yang, Y. *Nat. Mater.* 2005, 4, 864.
Kim, Y.; Cook, S.; Tuladhar, S. M.; Choulis, S. A.; Nelson, J.; Durrant, J. R.; Bradley, D. D. C.; Giles, M.; McCulloch, I.; Ha, C.; Ree, M. *Nat. Mater.* 2006, 5, 197.
Sievers, W. D.; Shrotriya, V.; Yang, Y. *J. Appl. Phys.* 2006, 100, 114509.
Huang, J.; Xu, Z.; Yang, Y. *Adv. Funct. Mater.* 2007, 17, 1966.
Li, G.; Chu, C.-W.; Shrotriya, V.; Huang, J.; Yang, Y. *Appl. Phys. Lett.* 2006, 88, 253503.
Greczynski, G.; Kugler, T.; Keil, M.; Osikowicz, W.; Fahlman, M.; Salaneck, W.R. *J. Electron Spectrosc. Relat. Phenom.* 2001, 121, 1.
O'Regan, B.; Grätzel, M. *Nature* 1991, 353, 737.
Oey, C. C.; Djurišić, A. B.; Wang, H.; Man, K. K. Y.; Chan, W. K.; Xie, M. H.; Leung, Y. H.; Pandey, A.; Nunzi, J.-M.; Chui, P. C. *Nanotechnology* 2006 17, 706.
Niederberger, M.; Bartl, M. H.; Stucky, G. D. *Chem. Mater.* 2002, 14, 4364.
Wang, J.; Polleux, J.; Lim, J.; Dunn, B. *J. Phys. Chem. C* 2007, 111, 14925.
Atashbar, M. Z.; Sun, H. T.; Gong, B.; Wlodarski, W.; Lamb, R. *Thin Solid Films* 1998, 326, 238.
Ingo, G. M.; Dire, S.; Babonneau, F. *Appl Surf. Science* 1993, 70; 230.
Grant, A. W.; Campbell, C. T. *Phys. Review. B* 1997, 55, 1844.
Hardman, P. J.; Casanova, R.; Prabhakaran, K.; Muryn, C. A.; Wincott, P. J.; Thornton, G. *Surf. Sci.* 1992, 269, 677.
Brabec, C. J.; Cravino, A.; Meissner, D.; Sariciftci, N. S.; Fromherz, T.; Rispens, M. T.; Sanchez, L.; Hummelen, J. C. *Adv. Funct. Mater.* 2001, 11, 374.
Huang, J.; Li, G.; Yang, Y. *Adv. Mater.* 2008, 20, 415.
Juška, G.; Arlauskas, K.; Viliūnas, M.; Genevičius, K.; Österbacka, R.; Stubb, H. *Phys. Rev. B* 2000, 62, R16235.
Huang, J.; Li, G.; Wu, E.; Xu, Q.; Yang, Y. *Adv. Mater.* 2006, 18, 114.
Huang, J.; Watanabe, T.; Ueno, K.; Yang, Y. *Adv. Mater.* 2007, 19, 739.e.

\* cited by examiner

Figure 11A
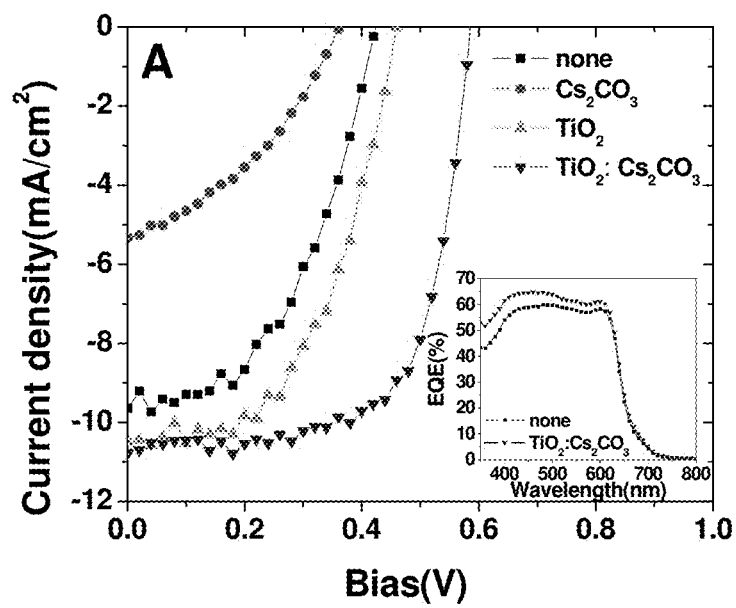
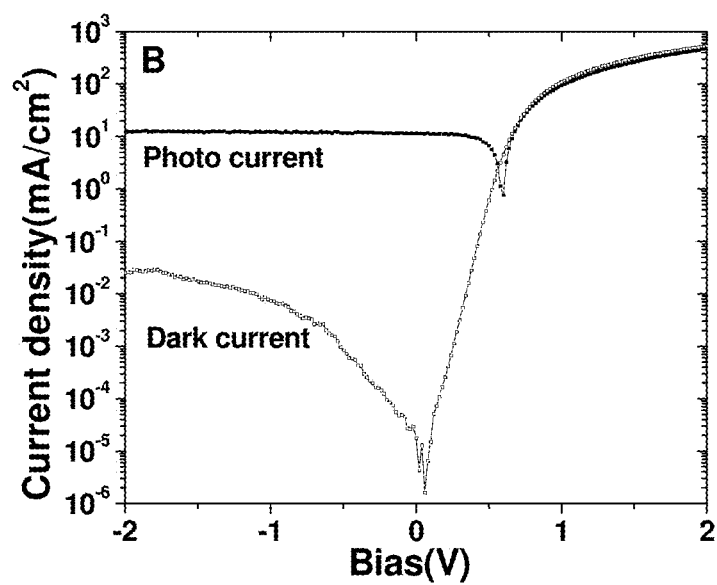
Figure 11B

| device | $V_{oc}$ (V) | $J_{sc}$ (mA/cm$^2$) | PCE (%) | FF(%) |
|---|---|---|---|---|
| /ITO/PEDOT/PP/Al | 0.42 | 9.64 | 2.0 | 48 |
| /ITO/PEDOT/PP/Cs$_2$CO$_3$/Al | 0.36 | 5.34 | 0.7 | 37 |
| /ITO/PEDOT/PP/TiO$_2$/Al | 0.46 | 10.48 | 2.4 | 50 |
| /ITO/PEDOT/PP/TiO$_2$:Cs$_2$CO$_3$/Al | 0.58 | 10.76 | 4.2 | 67 |

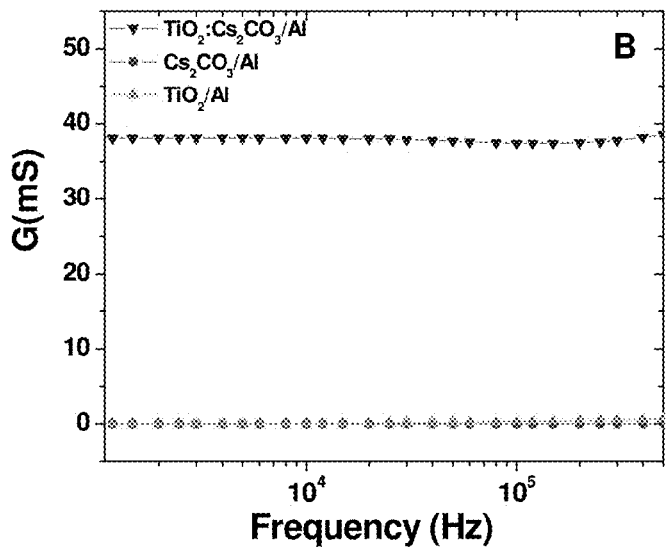
Figure 13B
Figure 14A
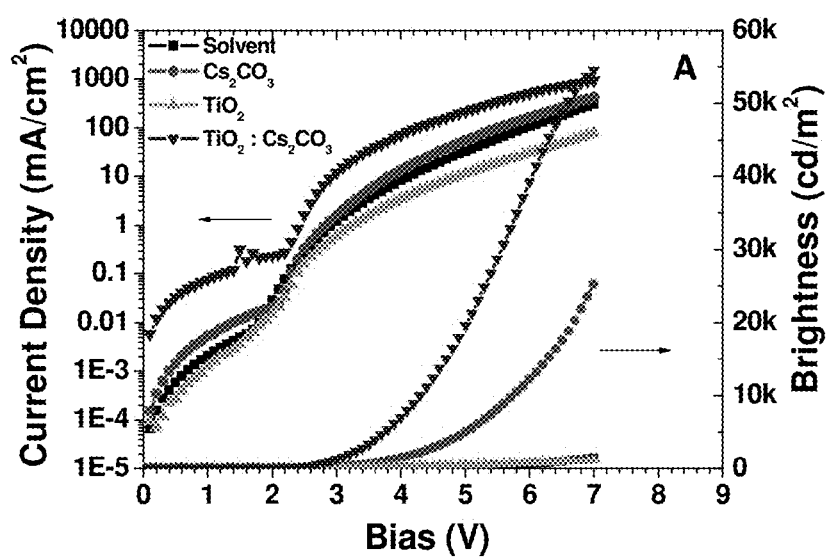

SOLUTION PROCESSABLE MATERIAL FOR ELECTRONIC AND ELECTRO-OPTIC APPLICATIONS

BACKGROUND

1. Field of Invention

Embodiments of this invention relate to materials for electro-optic devices, electro-optic devices that use the materials and methods of producing the materials and electro-optic devices. More particularly, embodiments of this invention relate to materials for electro-optic devices that are blends of a metal oxide and at least one other material that increases electrical conductivity and/or decreases a work function of a layer of such a material when blended with the metal oxide, to electro-optic devices that use the materials and methods of producing the materials and electro-optic devices.

2. Discussion of Related Art

The contents of all references referred to herein, including articles, published patent applications and patents are hereby incorporated by reference.

Electronic devices based on organic materials (small molecules and polymers) have attracted broad interest. Such devices include organic light emitting devices (OLEDs) (Tang, C. W.; VanSlyke, S. A. *Appl. Phys. Lett.* 1987, 51, 913), organic photovoltaic cells (OPVs) (Tang, C. W. *Appl. Phys. Lett.* 1986, 48, 183), transistors (Bao, Z.; Lovinger, A. J.; Dodabalapur, A. *Appl. Phys. Lett.* 1996, 69, 3066), bistable devices and memory devices (Ma, L. P.; Liu, J.; Yang, Y. *Appl. Phys. Lett.* 2002, 80, 2997), etc. Some of the most salient attributes of polymer electronics is that they can be very low-cost, flexible, operate with low-energy consumption, can be produced with high-throughput processing, and can be versatile for applications (Forrest, S. R. *Nature* 2004, 428, 911). To fulfill the requirement of low cost, a solution process is highly desirable. Within the field of organic electronics, the metal/organic interface plays a critical role in determining the device performance. The interface can often be modified by some functional interfacial layer in order to improve device performance. Depending on the characteristics of the material, the functional interfacial layer can be employed in different configurations. Early prominent examples in the development of OLEDs and OPVs include—(1) Introducing LiF, CsF, AlO$_x$, etc. as an electron buffer layer in OLEDs (Hung, L. S.; Tang, C. W.; Mason, M. G. *Appl. Phys. Lett.* 1997, 70, 152; Grozea, D.; Turak, A.; Feng, X. D.; Lu, Z. H.; Johnson, D.; Wood, R. *Appl. Phys. Lett.* 2002, 81, 3173; Kin, Z.; Hino, Y.; Kajii, H.; Ohmori, Y. *Mol. Cryst. Liq. Cryst.*, 2007, 462, 225); (2) Application of polyaniline (PANI) (Yang, Y.; Heeger, A. J. *Appl. Phys. Lett.* 1994, 64, 1245) and poly(3,4-ethylenedioxythiophene):poly(styrene sulfonate) (PEDOT:PSS) as a hole transport/buffer layer (Jonas, F.; Krafft, W.; Muys, B. *Macromol. Symp.* 1995, 100, 169); (3) Insertion of a TiO$_x$ layer as an optical spacer/hole blocking layer (Kim, J. Y.; Kim, S. H.; Lee, H.-H.; Lee, K.; Ma, W.; Gong, X.; Heeger, A. J. *Adv. Mater.* 2006, 18, 572; Hayakawa, A.; Yoshikawa, O.; Fujieda, T.; Uehara, K.; Yoshikawa, S. *Appl. Phys. Lett.* 2007, 90, 163517); (4) Combination of an n- and p-type transport layer for tandem OLEDs (e.g. LiF-V$_2$O$_5$) (Chu, C.-W.; Chen, C.-W.; Li, S.-H.; Wu, E. H.-E.; Yang, Y. *Appl. Phys. Lett.* 2005, 86, 253503).

Solar cells, also known as photovoltaic (PV) cells or devices, generate electrical power from incident light. The term "light" is used broadly herein to refer to electromagnetic radiation which may include visible, ultraviolet and infrared light. Traditionally, PV cells have been constructed of a number of inorganic semiconductors, e.g., crystalline, polycrystalline and amorphous silicon, gallium arsenide, cadmium telluride and others. More recently, PV cells have been constructed using organic materials.

Solar cells are characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs as well as other possible advantageous properties.

PV devices produce a photo-generated voltage when they are connected across a load and are irradiated by light. When irradiated without any external electronic load, a PV device generates its maximum possible voltage, V open-circuit, or $V_{OC}$. If a PV device is irradiated with its electrical contacts shorted, a maximum short-circuit current, or $I_{SC}$, is produced. (Current is conventionally referred to as "I" or "J".) When actually used to generate power, a PV device is connected to a finite resistive load in which the power output is given by the product of the current and voltage, I×V. The maximum total power generated by a PV device is inherently incapable of exceeding the product $I_{SC} \times V_{OC}$. When the load value is optimized for maximum power extraction, the current and voltage have values, $I_{max}$ and $V_{max}$, respectively. A figure of merit for solar cells is the fill factor, ff (or FF), defined as:

$$ff = \frac{I_{max} V_{max}}{I_{SC} V_{OC}}$$

where ff is always less than 1, as $I_{SC}$ and $V_{OC}$ are never achieved simultaneously in actual use. Nonetheless, as ff approaches 1, the device is more efficient.

When electromagnetic radiation of an appropriate energy is incident upon a semiconductive organic material, for example, an organic molecular crystal (OMC) material, or a polymer, a photon can be absorbed to produce an excited molecular state. This energy absorption is associated with the promotion of an electron from a bound state in the highest occupied molecular orbital (HOMO) to the lowest unoccupied molecular orbital (LUMO), or equivalently, the promotion of a hole from the LUMO to the HOMO. In organic thin-film photoconductors, the generated excited state is believed to be an exciton, i.e., an electron-hole pair in a bound state which is transported as a quasi-particle. The excitons can have an appreciable life-time before recombination. To produce a photocurrent the electron-hole pair must become separated, for example at a donor-acceptor interface between two dissimilar contacting organic thin films. The interface of these two materials is called a photovoltaic heterojunction. If the charges do not separate, they can recombine with each other (known as quenching) either radiatively, by the emission of light of a lower energy than the incident light, or non-radiatively, by the production of heat. Either of these outcomes is undesirable in a PV device. In traditional semiconductor theory, materials for forming PV heterojunctions have been denoted as generally being of either n (donor) type or p (acceptor) type. Here n-type denotes that the majority carrier type is the electron. This could be viewed as the material having many electrons in relatively free energy states. The p-type denotes that the majority carrier type is the hole. Such material has many holes in relatively free energy states. The type of the background majority carrier concentration depends primarily on unintentional doping by defects or impurities. The type and concentration of impurities determine the value of the Fermi energy, or level, within the gap between the highest occupied molecular orbital (HOMO) and the lowest unoccupied molecular orbital (LUMO), called the HOMO-LUMO gap. The Fermi energy characterizes the statistical occupation of molecular quantum energy states denoted by the value of energy for which the probability of occupation is equal to ½. A Fermi energy near the LUMO energy indicates that electrons are the predominant carrier. A Fermi energy near the HOMO energy indicates that holes are the predominant carrier. Accordingly, the Fermi energy is a primary characterizing property of traditional semiconductors and the PV heterojunction has traditionally been the p-n interface.

A significant property in organic semiconductors is carrier mobility. Mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of HOMO levels producing higher hole mobility, or similarly, higher overlap of LUMO levels to produce higher electron mobility. Moreover, the donor or acceptor nature of an organic semiconductor may be at odds with the higher carrier mobility. The result is that device configuration predictions from donor/acceptor criteria may not be borne out by actual device performance. Due to these electronic properties of organic materials, the nomenclature of "hole-transporting-layer" (HTL) or "electron-transporting-layer" (ETL) is often used rather than designating them as "p-type" or "acceptor-type" and "n-type" or "donor-type". In this designation scheme, an ETL will be preferentially electron conducting and an HTL will be preferentially hole transporting.

Organic PV cells have many potential advantages when compared to traditional silicon-based devices. Organic PV cells are light weight, economical in the materials used, and can be deposited on low cost substrates, such as flexible plastic foils. However, organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process. That is, carrier generation requires exciton generation, diffusion and ionization. However, the diffusion length ($L_D$) of an exciton is typically much less than the optical absorption length, requiring a trade off between using a thick, and therefore resistive, cell with multiple or highly folded interfaces, or a thin cell with a low optical absorption efficiency.

For polymer solar cells, the polymer/fullerene based bulk-heterojunction (BHJ) solar cell is the most common device architecture (Li, G.; Shrotriya, V.; Huang, J.; Yao, Y.; Moriarty, T.; Emery, K.; Yang, Y. Nat. Mater. 2005, 4, 864; Kim, Y.; Cook, S.; Tuladhar, S. M.; Choulis, S. A.; Nelson, J.; Durrant, J. R.; Bradley, D. D. C.; Giles, M.; McCulloch, I.; Ha, C.; Ree, M. Nat. Mater. 2006, 5, 197; Sievers, W. D.; Shrotriya, V.; Yang, Y. J. Appl. Phys. 2006, 100, 114509) for which a recently certified solar cell efficiency of 5.4% in a single cell configuration was achieved. Recently we showed that when salts like $Cs_2CO_3$ or CsF are applied as an n-type interfacial layer between the polymer active layer and the aluminum electrode, photovoltage (open-circuit voltage Voc), fill-factor (FF) and device efficiency all improve. In addition, application of $Cs_2CO_3$ (both by thermal evaporation and solution processes) as an effective electron injection/buffer layer leads to record high white and red PLEDs with significantly reduced driving voltage and enhanced lifetime (Huang, J.; Xu, Z.; Yang, Y. Adv. Funct. Mater. 2007, 17, 1966). Combined with novel p-type interfacial layers such as transition metal oxides ($V_2O_5$, $MoO_3$, $WO_3$ etc.), we successfully demonstrated efficient inverted polymer solar cells (Li, G.; Chu, C.-W.; Shrotriya, V.; Huang, J.; Yang, Y. Appl. Phys. Lett. 2006, 88, 253503; Shrotriya, V.; Li, G.; Yao, Y.; Chu, C.-W.; Yang, Y. Appl. Phys. Lett. 2006, 88, 073508). Furthermore, the sol-gel process titanium sub-oxide ($TiO_x$) and zinc oxide (ZnO) were recently shown to be an effective n-type buffer material for improving solar cell efficiency (Li, G.; Shrotriya, V.; Huang, J.; Yao, Y.; Moriarty, T.; Emery, K.; Yang, Y. Nat. Mater. 2005, 4, 864). However, there remains a need for improved organic photovoltaic devices.

SUMMARY

An electro-optic device according to an embodiment of the current invention has a first electrode, a second electrode spaced apart from the first electrode, an active layer disposed between the first electrode and the second electrode, and an interfacial layer in contact with the active layer. The interfacial layer comprises a blend of a metal oxide and a salt according to an embodiment of the current invention. The interfacial layer comprises a blend of a metal oxide and a second material that at least one of reduces a work function or increases an electrical conductivity of the interfacial layer according to an embodiment of this invention.

A method of producing an electro-optic device according to an embodiment of the current invention includes forming an active polymer layer, and forming an interfacial layer on a surface of said active polymer layer. Forming the interfacial layer includes forming the interfacial layer from a blend of a metal oxide and a salt according to an embodiment of the current invention. Forming the interfacial layer includes forming the interfacial layer from a blend of a metal oxide and a second material that at least one of reduces a work function or increases an electrical conductivity of the interfacial layer according to an embodiment of this invention.

A composition according to an embodiment of the current invention is a blend of at least one metal oxide and at least one salt in a ratio, by volume, of at least 1:0.1 and less than 1:1.2.

BRIEF DESCRIPTION OF THE DRAWINGS

The invention may be better understood by reading the following detailed description with reference to the accompanying figures in which:

FIG. 11A shows J-V characteristics of a P3HT:$PC_{70}$BM based photovoltaic cell with an evaporated Al cathode and with different interfacial layers (none; $Cs_2CO_3$; $TiO_2$; $TiO_2$:$Cs_2CO_3$) and External Quantum efficiencies (EQE) of the device with and without the $TiO_2$:$Cs_2CO_3$ interfacial layer (inset);

FIG. 11B shows the J-V curve of an inverted solar cell with $TiO_2$:$Cs_2CO_3$ in the dark and under an illumination of AM1.5;

FIG. 12 is a table summarizing photovoltaic performances of corresponding devices with different interfacial layers;

FIGS. 13A and 13B show CELIV extraction peaks and conductance data, respectively, for the /ITO/PEDOT/P3HT:$PC_{70}$BM/interfacial layer/Al device with $Cs_2C O_3$; $TiO_2$; $TiO_2$:$Cs_2CO_3$;

FIGS. 14A and 14B show Current density—Voltage—Brightness characteristics and current efficiency, respectively, for the ITO/PEDOT/LEP/EIL/Al device with different interfacial layers (none; $Cs_2CO_3$; $TiO_2$; $TiO_2$:$Cs_2CO_3$);

DETAILED DESCRIPTION

In describing embodiments of the present invention, specific terminology is employed for the sake of clarity. However, the invention is not intended to be limited to the specific terminology so selected. It is to be understood that each specific element includes all technical equivalents which operate in a similar manner to accomplish a similar purpose.

Figure 1:
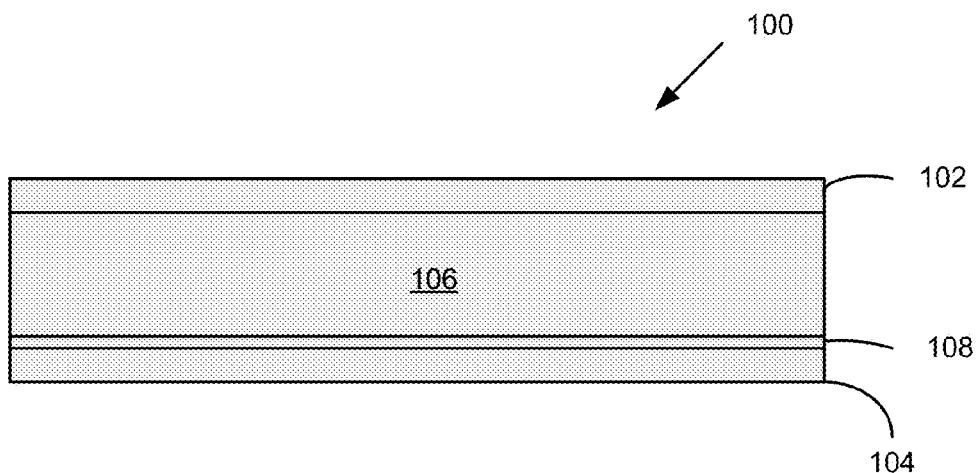
FIG. 1 is a schematic illustration of an electro-optic device according to an embodiment of the current invention.

FIG. 1 is a schematic illustration of an electro-optic device 100 according to an embodiment of the current invention. The electro-optic device 100 has a first electrode 102, a second electrode 104 spaced apart from the first electrode 102, and an active layer 106 disposed between the first electrode and the second electrode. The electro-optic device 100 also has an interfacial layer 108 in contact with the active layer 106. The term active layer is intended to have a broad meaning that includes a layer of material that can absorb light to provide a current and/or can emit light in response to an electrical current. For example, the active layer may include organic and/or inorganic semiconductors. In addition, although the interfacial layer 108 is illustrated as being on the side of the active layer 106 that is closest to the second electrode 104 in the example of FIG. 1, it could also be located on the other side of the active layer 106 that is closest to the first electrode 102 in other embodiments of the current invention. Furthermore, the invention is not limited to only active layer 106 and interfacial layer 108 between the first electrode 102 and second electrode 104. Additional active layers, additional interfacial layers and/or other layers of material may also be included between the first electrode 102 and the second electrode 104 according to some embodiments of the current invention. Some specific examples will be described below in this specification, without limitation, that have additional layers between first and second electrodes.

The interfacial layer 106 is a blend of a metal oxide and at least one other material that provides at least one of a decrease in the work function or an increase of electrical conductivity of the interfacial layer 106 compared to the metal oxide alone. For example, the interfacial layer 106 can be a blend of a metal oxide and a salt according to an embodiment of the current invention. In one example, the metal oxide can be titanium oxide and the salt can be cesium carbonate. In an embodiment the interfacial layer 106 can be a blend of titanium oxide and cesium carbonate in a ratio of at least about 1:0.1 and less than about 1:1.2. In an embodiment the interfacial layer 106 can be a blend of titanium oxide and cesium carbonate in a ratio of about 1:1. However, the at least one additional material in the blend for the interfacial layer 106 is not limited to only salts. It may also include a metal composite consisting of metal salt and/or metal ions, or a doping component. The metal element of the composite can include, but is not limited to, Pt, Pd, Ni and Au. The metal composition can be any compound having at least one element selected from the list above. The doping component can be at least one element selected from the group consisting of O, N, Fe, V, Nb and W. In addition, the salt is not limited to only cesium carbonate. It may also include one or more alkali metal carbonate and/or alkali metal fluoride consisting of Li, Na, K, Rb and Cs, or combinations thereof.

Figure 2:
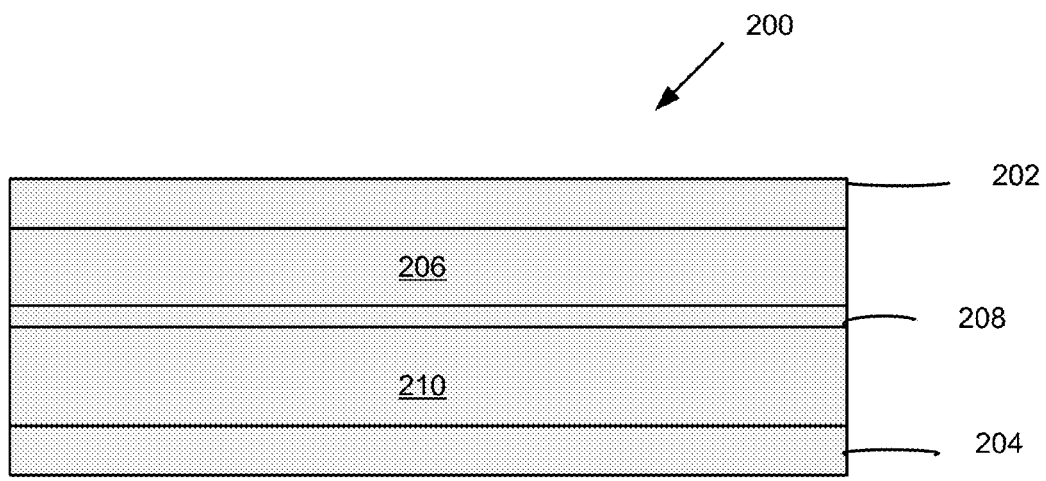
FIG. 2 is a schematic illustration of an electro-optic device according to another embodiment of the current invention.

FIG. 2 is a schematic illustration of an electro-optic device 200 according to another embodiment of the current invention. The electro-optic device 200 has a first electrode 202, a second electrode 204 spaced apart from the first electrode 202, and an active layer 206 disposed between the first electrode and the second electrode. The electro-optic device 200 also has an interfacial layer 208 in contact with the active layer 206. This embodiment is an example of an electro-optic device that has a second active layer 210 between the first electrode 202 and the second electrode 204. In this case, there is an interfacial layer 208 that is sandwiched between and in contact with two active layers.

Figure 3:
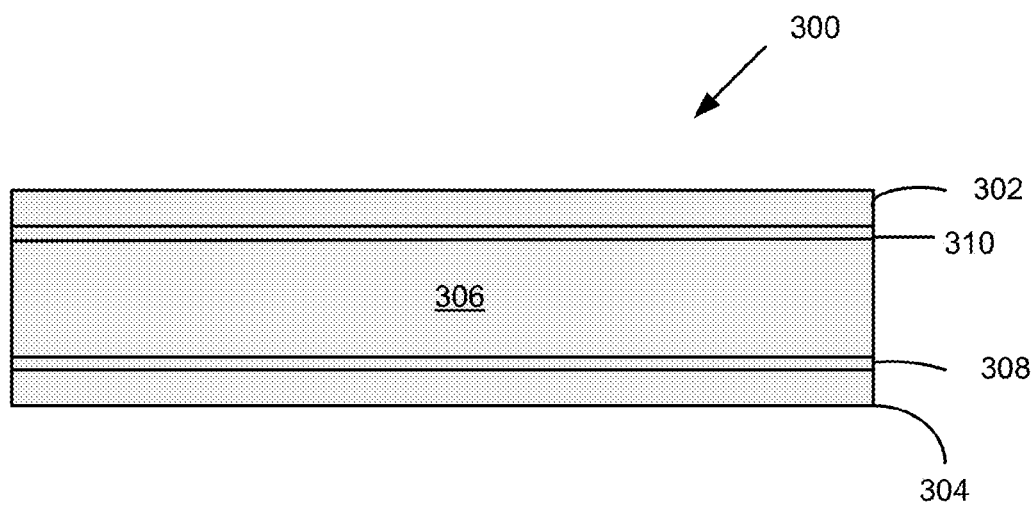
FIG. 3 is a schematic illustration of a photovoltaic cell according to an embodiment of the current invention.

FIG. 3 is a schematic illustration of an electro-optic device 300 according to another embodiment of the current invention. The electro-optic device 300 has a first electrode 302, a second electrode 304 spaced apart from the first electrode 302, and an active layer 306 disposed between the first electrode and the second electrode. The electro-optic device 300 also has an interfacial layer 308 in contact with the active layer 306 and the second electrode 304. In this embodiment, the first electrode 302 is a transparent electrode and the electro-optic device is a photovoltaic cell. The electro-optic device 300 also has a hole transport layer 310 arranged between and in contact with the active layer 306 and the first electrode 302.

Figure 4:
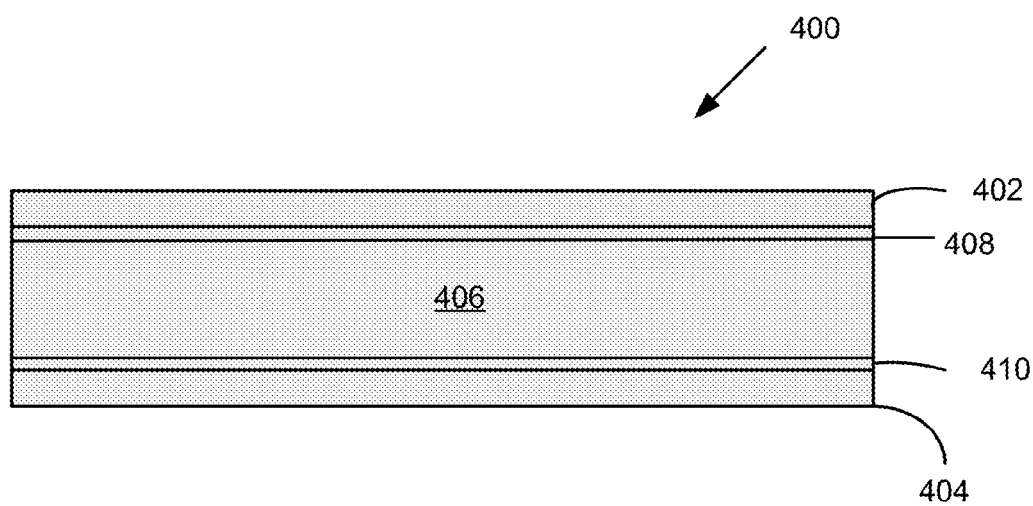
FIG. 4 is a schematic illustration of an inverse photovoltaic cell according to an embodiment of the current invention.

FIG. 4 is a schematic illustration of an electro-optic device 400 according to another embodiment of the current invention. The electro-optic device 400 has a first electrode 402, a second electrode 404 spaced apart from the first electrode 402, and an active layer 406 disposed between the first electrode and the second electrode. The electro-optic device 400 also has an interfacial layer 408 in contact with the active layer 406 and the first electrode 402. In this embodiment, the first electrode 402 is a transparent electrode and the electro-optic device is an inverted photovoltaic cell. The electro-optic device 400 also has a hole buffer layer 410 arranged between and in contact with the active layer 406 and the second electrode 404.

Figure 5:
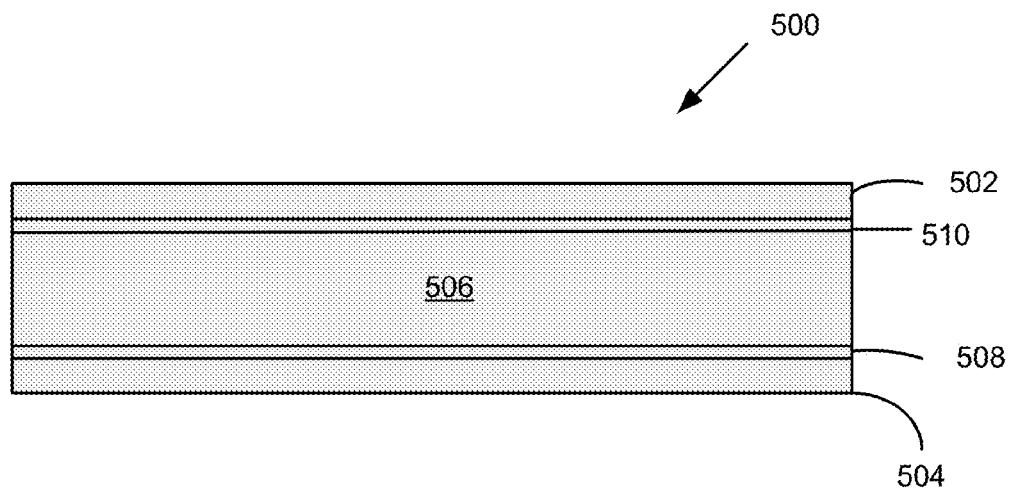
FIG. 5 is a schematic illustration of a light-emitting diode according to an embodiment of the current invention.

FIG. 5 is a schematic illustration of an electro-optic device 500 according to another embodiment of the current invention. The electro-optic device 500 has a first electrode 502, a second electrode 504 spaced apart from the first electrode 502, and an active layer 506 disposed between the first electrode and the second electrode. The electro-optic device 500 also has an interfacial layer 508 in contact with the active layer 506 and the second electrode 504. In this embodiment, the electro-optic device is a polymer light-emitting diode. The electro-optic device 500 also has a hole transport layer 510 arranged between and in contact with the active layer 506 and the first electrode 502.

Figure 6:
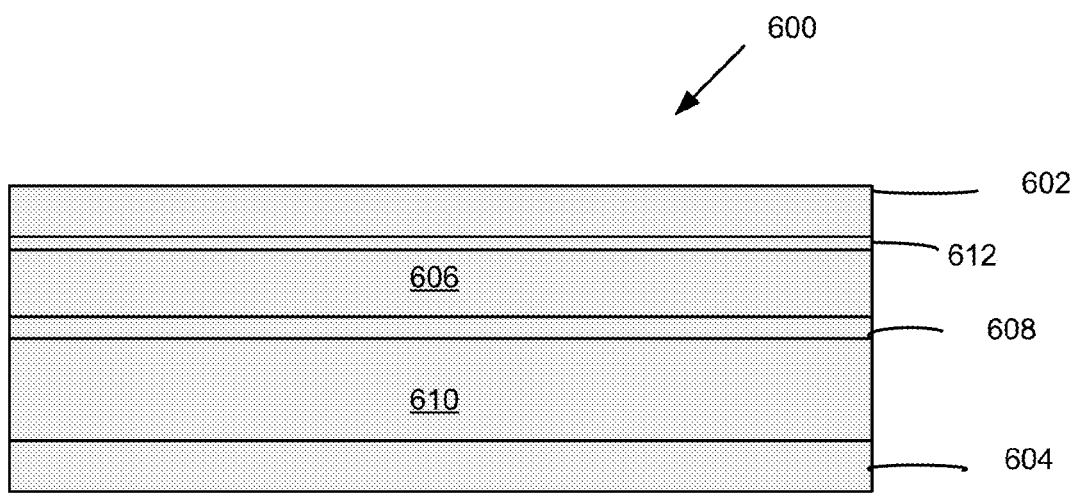
FIG. 6 is a schematic illustration of a tandem photovoltaic cell according to an embodiment of the current invention.

FIG. 6 is a schematic illustration of an electro-optic device 600 according to another embodiment of the current invention. The electro-optic device 600 has a first electrode 602, a second electrode 604 spaced apart from the first electrode 602, and an active layer 606 disposed between the first electrode and the second electrode. The electro-optic device 600 also has an interfacial layer 608 in contact with the active layer 606. The electro-optic device 600 has a second active layer 610 that is in contact with the interfacial layer such that the interfacial layer is sandwiched between the active layers 606 and 610. In this embodiment, the electro-optic device is a tandem photovoltaic cell. The electro-optic device 600 also has a hole transport layer 612 arranged between and in contact with the active layer 606 and the first electrode 602.

EXAMPLES

According to an embodiment of the current invention, we provide a method to make efficient organic electronic devices by utilizing a mixture of solution processable semiconducting metal oxides and salts to form functional interfacial layers in polymer electronics. One example is an anatase $TiO_2$ and $Cs_2CO_3$ blend. Introducing a nano-scale $TiO_2$ and $Cs_2CO_3$ interfacial layer can provide solar cell performance as good as a device with a low work-function metal Ca as an electrode which is easy to be oxidized (Greczynski, G.; Kugler, T.; Keil, M.; Osikowicz, W.; Fahlman, M.; Salaneck, W. R. *J. Electron Spectrosc. Relat. Phenom.* 2001, 121, 1). The effectiveness of this unique approach is expanded to polymer LEDs in other particular embodiments of this invention where a lower driving voltage, improved efficiency and extended lifetime are again demonstrated.

Figures 7A, 7B:
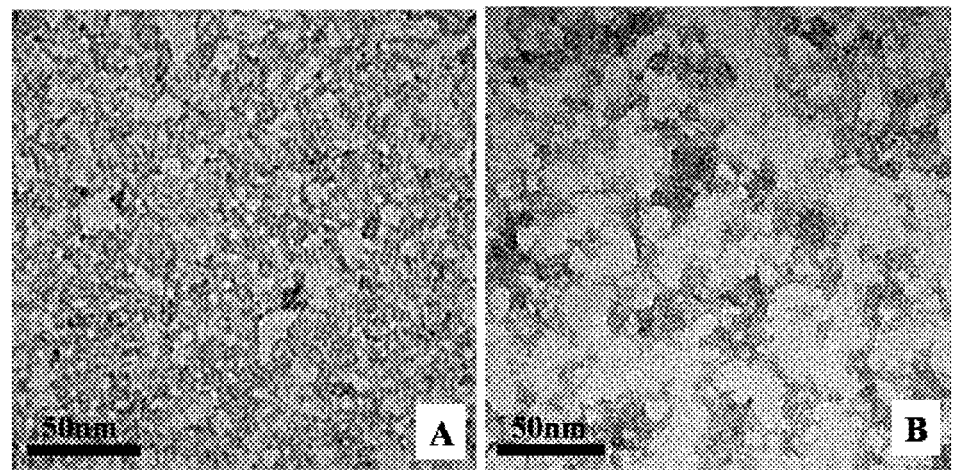
FIGS. 7A and 7B show TEM images of $TiO_2$ and a mixed solution of $TiO_2$:$Cs_2CO_3$, respectively.

Semiconducting $TiO_2$ has been extensively studied as a promising material in a variety of applications including dye-sensitized solar cells, sensitization, organic photovoltaics (O'Regan, B.; Grätzel, M. *Nature* 1991, 353, 737; Oey, C. C.; Djurišić, A. B.; Wang, H.; Man, K. K. Y.; Chan, W. K.; Xie, M. H.; Leung, Y. H.; Pandey, A.; Nunzi, J.-M.; Chui, P. C. *Nanotechnology* 2006, 17, 706). It is widely accepted that the application of nanocrystalline $TiO_2$ to photovoltaics remains limited due to the hydrothermal processing or calcinations to induce crystallization (Niederberger, M.; Bartl, M. H.; Stucky, G. D. *Chem. Mater.* 2002, 14, 4364). A feature of $TiO_2$ according to some embodiments of the current invention is the use of the nanocrystalline anatase form produced by a nonhydrolitic sol-gel process at low temperatures. This approach can provide several important advantages in some embodiments: (a) the elimination of additional agents allows low particle agglomeration; (b) no exposure to air is needed; and (c) the elimination of water enables the formation of homogeneous films (Niederberger, M.; Bartl, M. H.; Stucky, G. D. *Chem. Mater.* 2002, 14, 4364). It is worth noting that the anatase crystalline form was obtained even with the as-prepared sol-gel $TiO_2$, which is soluble in certain solvents at room temperature. This eliminates the high temperature sintering process (400-500° C.) which otherwise inhibits the application of crystalline $TiO_2$'s in regular OPV structures. The synthesis of crystalline $TiO_2$ nano-particles follows a method that can be found in the literature (Wang, J.; Polleux, J.; Lim, J.; Dunn, B. *J. Phys. Chem. C* 2007, 111,14925). All chemicals were purchased from Sigma-Aldrich and used as received. 0.5 mL of $TiCl_4$ was slowly added into 2 mL of ethanol and mixed with 10 mL of benzyl alcohol. After stirring the solution for 9 hrs at 80° C., 12 mL of diethyl ether for every 1 mL of solution was used for washing and the white color $TiO_2$ precipitate was obtained from centrifuging the crude product. The final solution was prepared by dispersing in ethanol. A solution of $TiO_2$ and $Cs_2CO_3$ was obtained by blending 0.2 wt % of $Cs_2CO_3$ in 2-ethoxyethanol solution with $TiO_2$ solution (0.2 wt %) in a 1:1 volume ratio. The solution was used after vigorous stirring for several hours. Transmission electron microscopy (TEM, JEOL JEM-1200EX) images of $TiO_2$ and the mixture of $TiO_2$:$Cs_2CO_3$ are shown in FIGS. 7A and 7B, respectively. An overview image of $TiO_2$ nanoparticles illustrates that the material is entirely composed of nano-sized particles homogeneously distributed throughout the material. As we continue to blend with $Cs_2CO_3$, TEM images show that the product consists of markedly more monodispersed shapes. The TEM image (not shown) of the solution mixture taken one week after being exposed to air shows that the mixture is stable and the product has not agglomerated due to the addition of $Cs_2CO_3$, which has a stabilizing effect on the solution by preventing the three dimensional titania network from shrinkage, which is observed in pure $TiO_2$ solutions (Wang, J.; Polleux, J.; Lim, J.; Dunn, B. *J. Phys. Chem. C* 2007, 111,14925).

Figure 8:
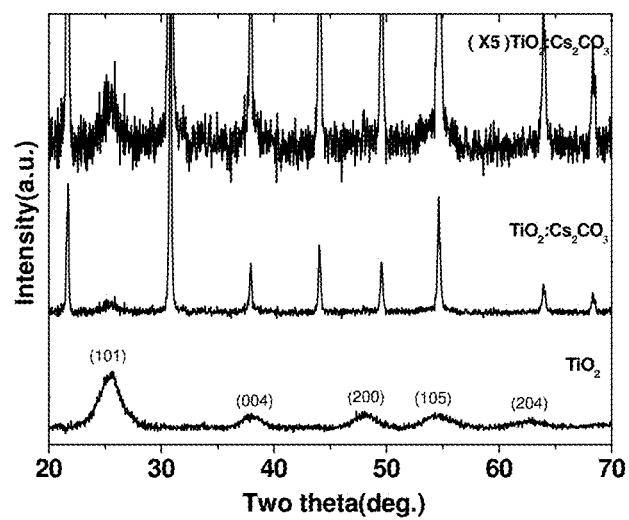
FIG. 8 shows X-ray powder diffraction patterns for $TiO_2$ (bottom), and $TiO_2$:$Cs_2CO_3$ over view (middle) and zoomed in (top)

The crystalline phase evolution of these two samples was monitored with an X-ray powder diffractometer (PANalytical X'Pert Pro). The powder samples with the composition of $TiO_2$ and $TiO_2$:$Cs_2CO_3$ for X-ray diffraction (XRD) analysis were prepared by evaporating the solvent at 110° C. in an oven. FIG. 8 shows the XRD data. The X-ray powder diffraction pattern for $TiO_2$ obtained by the sol-gel method confirms the existence of nano-crystalline $TiO_2$ in the anatase form, which agrees well with literature (Niederberger, M.; Bartl, M. H.; Stucky, G. D. *Chem. Mater.* 2002, 14, 4364; Wang, J.; Polleux, J.; Lim, J.; Dunn, B. *J. Phys. Chem. C* 2007, 111, 14925). All the peaks are ascribed to the anatase crystal structure without any secondary reaction impurities. The indexed broad peaks indicate the nano-crystalline nature of $TiO_2$ with size between 7-8 nm. The XRD spectrum of $TiO_2$:$Cs_2CO_3$ and enlarged spectrum are shown in FIG. 8. When $Cs_2CO_3$ is added to sol-gel $TiO_2$, the XRD spectra are assigned by the peak pattern for the anatase phase of $TiO_2$ as well as CsCl cubic structure, which can be formed by reaction of residual benzyl chloride as side products from the stock $TiO_2$ solution with $Cs_2CO_3$. The narrowed peak width of CsCl shows the characteristics of highly ordered crystalline CsCl compared to $TiO_2$. On the other hand, the existence of nano-crystalline anatase $TiO_2$ in the $TiO_2$:$Cs_2CO_3$ sample is evidenced by the similar peak width and intensity from the enlarged XRD data.

Figure 9:
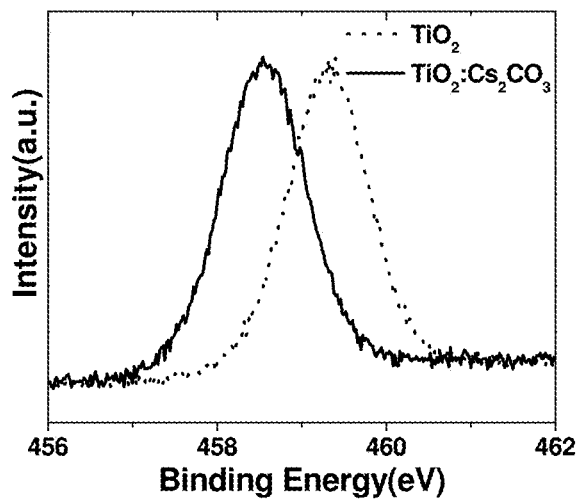
FIG. 9 shows XPS profiles of $TiO_2$ (dot line) and $TiO_2$:$Cs_2CO_3$ (solid line) samples for the Ti peak.
Figure 10:
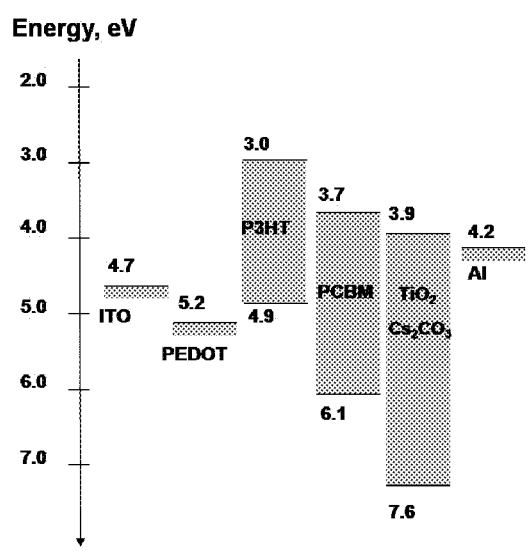
FIG. 10 shows a corresponding energy level diagram of a device based on a $TiO_2$:$Cs_2CO_3$ interfacial layer.

X-ray photoemission spectroscopy (XPS) was performed in an Omicron Nanotechnology system to further investigate the surface characteristics of $TiO_2$ and the $Cs_2CO_3$ interfacial layer. The data are shown in FIG. 9. The samples are prepared from spin casting on an Ag coated Si wafer and the instrument was calibrated using an internal Ag standard. The atomic ratio of oxygen to titanium was estimated to be 1.99 based on the integrated area under the element peak and sensitivity factor for the element, calibrated using commercially available crystalline $TiO_2$ powder as a reference (Sigma Aldrich, used as received). The data implies that titanium dioxide prepared from the non-hydrolytic sol-gel method is chemically stoichiometric, which is also in good agreement with the previously reported Ti $2p_{3/2}$ peak position for $TiO_2$ (Atashbar, M. Z.; Sun, H. T.; Gong, B.; Wlodarski, W.; Lamb, R. *Thin Solid Films* 1998, 326, 238). We note that the Ti $2p_{3/2}$ spectra for $TiO_2$:$Cs_2CO_3$ solution shifts towards lower binding energy by 0.78 eV as compared to the value for $TiO_2$. We suspect that this change is due to the presence of Ti-O-Cs bonds, which is supported by studies on a Fe-doped $SiO_2$ system (Ingo, G. M.; Dire, S.; Babonneau, F. *Appl. Surf. Science* 1993, 70, 230). It is also consistent with previous reports that the Ti(2p) peaks shift considerably to lower binding energy upon Cs or K adsorption (Grant, A. W.; Campbell, C. T. *Phys. Review. B* 1997, 55, 1844; Hardman, P. J.; Casanova, R.; Prabhakaran, K.; Muryn, C. A.; Wincott, P. J.; Thornton, G. *Surf Sci.* 1992, 269, 677). The Cs $3d_{5/2}$ peak position of $TiO_2$:$Cs_2CO_3$ shifted toward low binding energy, compared to that of $Cs_2CO_3$ also supports the bonding formation between $TiO_2$ and Cs. Metals in an organic/inorganic matrix can act as a doping component. This discrepancy of XPS survey spectra may be explained by the possibility of formation of Cs-doped $TiO_2$ materials. The energy level of both $TiO_2$ and $TiO_2$:$Cs_2CO_3$ samples have been determined with electrochemical cyclic voltammetry (C-V) and the energy offset wavelength on UV-vis absorption spectra. The energy level diagram is shown in the FIG. 10

The photovoltaic devices in the current examples were fabricated based on a blend of poly (3-hexylthiophene) (P3HT) and [6,6]-phenyl-$C_{71}$-butyric acid methyl ester ($PC_{70}BM$) system using Al as a cathode as well as insertion of $Cs_2CO_3$ and $TiO_2$ and mixture of $TiO_2$:$Cs_2CO_3$ as an interfacial layer between an active layer and the cathode. The polymer blend of P3HT: $PC_{70}BM$ was spin casted on the poly(3, 4-ethylenedioxy thiophene):poly(styrene sulfonate) (PEDOT:PSS) deposited ITO glass, followed by a thermal annealing at 110° C. The interfacial layer was spin cast from each solution and the film was then annealed at 80° C. The device fabrication was completed by thermal evaporation of 100 nm of Al as a cathode. The current density-voltage (J-V) characteristics under AM 1.5G one-sun illumination is shown in FIG. 11A and the summary of the device performance is listed in the table in FIG. 12. Comparison of devices with an Al electrode to that with $Cs_2CO_3$/Al shows decreasing Voc and Jsc upon the insertion of a spin-casted film of $Cs_2CO_3$. This implies that a $Cs_2CO_3$-only interfacial layer doesn't provide the appropriate function in terms of charge extraction and transport to the electrode. The insertion of a $TiO_2$ layer between the active layer and the evaporated Al cathode layer leads to an increase in Voc up to 0.46 eV. This may be due to the work function of $TiO_2$. It is known that open circuit voltage is generally determined by the difference between the highest occupied molecular orbital (HOMO) of donor and the lowest unoccupied molecular orbital (LUMO) of acceptor in the case of Ohmic contact between an active layer and a cathode (Brabec, C. J.; Cravino, A.; Meissner, D.; Sariciftci, N. S.; Fromherz, T.; Rispens, M. T.; Sanchez, L.; Hummelen, J. C. *Adv. Funct. Mater.* 2001, 11, 374). The conduction band level of $TiO_2$ is 4.3 eV as determined from a C-V experiment, which is slightly higher than the work function of the Al electrode. This brings unfavorable electron charge extraction from the active layer to electrode and an S-shape of the J-V curve is observed. On the other hand, we clearly see an improvement in Voc, Jsc and FF for the devices with a functional $TiO_2$:$Cs_2CO_3$ mixed film, consequently, resulting in efficient device performance. Voc increased from 0.42 V (for Al only device) to 0.58 V and FF is also dramatically improved up to 67%, giving power conversion efficiency of 4.2%, which is quite comparable to a device with a Ca/Al electrode. One possible reason may be attributed to the formation of the better Ohmic contact created by the decreased conduction band of the $TiO_2$:$Cs_2CO_3$ mixture layer (3.93 eV) such that the interfacial layer facilitates electron transport from the active layer to the cathode. Under dark conditions, the rectification ratios are ~$10^6$ and serial resistance is considerably decreased to 1-2 $\Omega \cdot cm^2$, while shunt resistance remains as high as close to $10^7$ $\Omega \cdot cm^2$, which makes it ideal for photovoltaics. It is believed that the $TiO_2$:$Cs_2CO_3$ layer can keep the hot Al electrode away from diffusion to the active layer during evaporation and offer good contact morphology between active layer and electrode. This is also supported by the dark current characteristics of the device with only Al where they have similar shunt resistance but higher serial resistance by several tens $\Omega \cdot cm^2$. In addition, the highly negative valence band location of the interfacial layer serves as an efficient hole blocking layer, which is confirmed by the small leakage current for $TiO_2$:$Cs_2CO_3$ based device. The External Quantum Efficiency (EQE) of the device using $TiO_2$:$Cs_2CO_3$ as an interfacial layer is shown in FIG. 11A (inset) as compared to the reference device with an Al electrode, which is consistent with the current density—voltage (J-V) characteristic. We note that the device utilizing only a CsCl interfacial layer doesn't correspond to any improved device characteristics including high Voc, FF and small serial resistance. This indicates that the CsCl layer does not play any direct role in efficiency improvement, although the CsCl component in XRD data seems to be a major component. Instead, nanocrystalline anatase phases derived from $TiO_2$ such as doped $TiO_2$ is likely to be a reason for efficiency enhancement.

An inverted structure was investigated in polymer solar cells using $Cs_2CO_3$ to modify the ITO electrode as a cathode and using a transition metal oxide $V_2O_5$ as a hole buffer layer. We reported inverted solar cells with an efficiency of 2.25% due to a non-optimized interfacial layer and active layer processes (Li, G.; Chu, C.-W.; Shrotriya, V.; Huang, J.; Yang, Y. *Appl. Phys. Lett.* 2006, 88, 253503). Thicker buffer layers on top of active materials can be applied in inverted cells, so the structure is more robust to transparent electrode deposition, e.g. ITO sputtering. A lamination process fabrication of semi-transparent and flexible solar cells was recently shown based on the same interface modification approach (Huang, J.; Li, G.; Yang, Y. *Adv. Mater.* 2008, 20, 415). Here we applied a $TiO_2$:$Cs_2CO_3$ mixture to replace $Cs_2CO_3$ and demonstrate the fabrication of highly efficient inverted polymer solar cells based on P3HT and PCBM. The sequence of the inverted device structure is as follows: /ITO/$TiO_2$:$Cs_2CO_3$/P3HT: $PC_{70}BM$/$V_2O_5$/Al. The $TiO_2$:$Cs_2CO_3$ layer was spin cast on ITO coated glass and thermal heat treatment was performed at 150 degrees for 30 min. After spin casting a polymer blend solution of P3HT:$PC_{70}BM$, followed by another thermal annealing at 110 degrees for 10 min, the device fabrication was completed by thermal evaporation of 5 nm of $V_2O_5$ and 80 nm of Al as an anode. The dark and photo (AM1.5, 100 mA/$cm^2$) J-V curves of the device with $TiO_2$:$Cs_2CO_3$ mixture interfacial layer are shown in FIG. 11B. For the device with a $TiO_2$:$Cs_2CO_3$ layer, optimization in the device fabrication again leads to improvements in Voc and FF, which subsequently results in a device efficiency of 3.9%, with Voc, Jsc and FF being 0.60V, 11.5 mA/cm² and 57%, respectively. The high rectification ratio is also attributed to the improved injection current at the forward bias as shown in the dark current.

Figures 12, 13A:
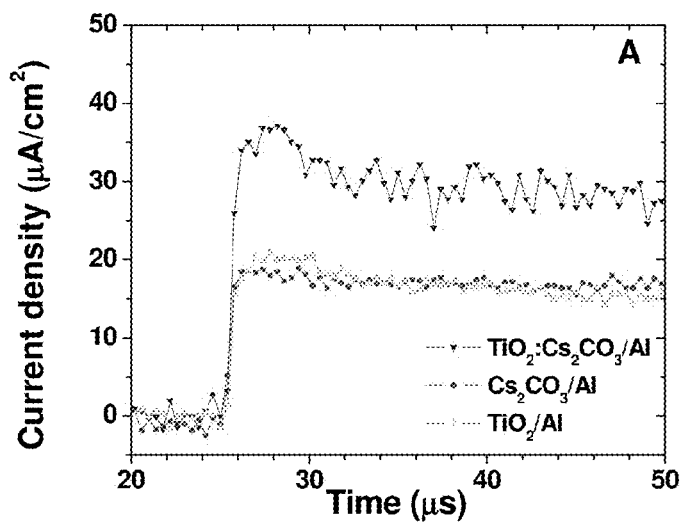

We used the Charge Extraction by Linearly Increasing Voltage (CELIV) method to investigate the charge carrier transport characteristics of the $TiO_2:Cs_2CO_3$ layer for some of representative regular configuration devices. In CELIV, the very initial rise speed is caused by the bulk conductivity of the sample and the time of extraction current maximum $t_{max}$ is used for the estimation of the drift mobility of equilibrium charge carriers (Juška, G.; Arlauskas, K.; Viliūnas, M.; Genevičius, K.; Österbacka, R.; Stubb, H. *Phys. Rev. B* 2000, 62, R16235). Under a ramping speed of $10^5$ V/cm, CELIV extraction peaks were obtained as shown in FIG. 13A. The change in $t_{max}$ is negligible and correspondingly little difference was observed in the mobility values for the different devices being of the order of $10^{-4}$ cm²/Vs for all devices. Impedance spectroscopy was used to measure the bulk conductivity of the samples. All our devices fitted well to the $R_p$-$C_p$ (resistor-capacitor in parallel) model wherein the conductance $$\left(G = \frac{1}{R_p}\right)$$

should be independent of the frequency and the susceptance ($B=j(2\pi*f*C_p)$) should vary linearly with frequency. Conductance data derived in this way is shown in FIG. 13B. The conductance for $TiO_2:Cs_2CO_3$ film was at least three orders of magnitude higher than the corresponding $Cs_2CO_3$/Al or $TiO_2$/Al devices. Since the number of charges extracted is directly proportional to the ratio of conductivity divided by mobility, we conclude that the devices with $TiO_2:Cs_2CO_3$ improve charge extraction from the polymer active layer. Additional support for this argument comes from the CELIV data. The area under the current density-time curve is the sum of the capacitive charges and the equilibrium charges extracted from the device. Subtracting the capacitive charges (initial current rise j(0)), we see that the area for the $TiO_2$:$Cs_2CO_3$/Al device is larger than the corresponding $TiO_2$/Al device. The equilibrium charge carriers extracted under dark for the $TiO_2:Cs_2CO_3$ devices are hence larger than that for $TiO_2$/Al devices.

Figure 14B:
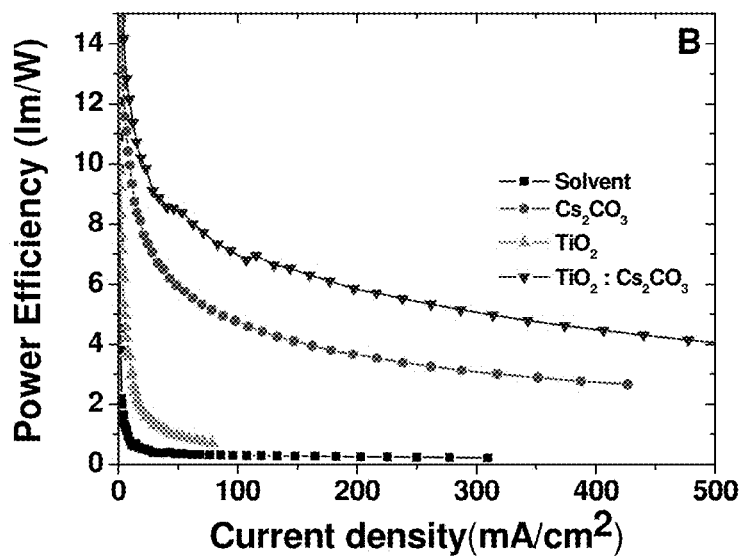

In an effort to explore the effectiveness of the $TiO_2$ and $Cs_2CO_3$ mixture layer, green-polyfluorene based PLEDs were constructed with the structure/ITO/PEDOT:PSS(40 nm)/light emitting polymer (LEP) (80 nm)/interfacial layer/Al, where the interfacial layer is (a) $TiO_2$, (b) $Cs_2CO_3$ and (c) $TiO_2:Cs_2CO_3$ mixture, all in 2-ethoxyethanol as solvent. To exclude the solvent effect on device performance, the solvent itself is spin-cast between LEP and Al to make a reference diode. FIG. 14A shows the comparison of current density—voltage—brightness (J-V-L) characteristics for the effects of different interfacial layers on device performance. The $Cs_2CO_3$ interfacial layer has been shown to be an effective electron-injection layer which leads to white and red emission PLEDs with record high power efficiency (Huang, J.; Li, G.; Wu, E.; Xu, Q.; Yang, Y. *Adv. Mater.* 2006, 18, 114; Huang, J.; Watanabe, T.; Ueno, K.; Yang, Y. *Adv. Mater.* 2007, 19, 739). The significant improvements in device performance have been attributed to the formation of a low work-function complex and surface dipole which can facilitate electron injection from the cathode (Huang, J.; Xu, Z.; Yang, Y. *Adv. Funct. Mater.* 2007, 17, 1966). Surprisingly, with the interfacial layer of $TiO_2:Cs_2CO_3$ mixture, further improvements in both current density and brightness are observed as compared to the $Cs_2CO_3$ and $TiO_2$ interfacial layer leading to a current efficiency of 11.5 cd/A or power efficiency of 14 μm/w at a bias of 2.8 V, as shown in FIG. 14B. The turn-on voltage (around 2.3 V) does not change, and implies that our PLEDs with the interfacial layer of $TiO_2:Cs_2CO_3$ mixture may not further lower the electron injection barrier compared with reference devices. However, the increases of current density and brightness suggest that better charge balance should be responsible for the efficiency enhancement. As discussed above, a nearly Ohmic contact is observed with the interface layer of $TiO_2:Cs_2CO_3$ mixture, supported by the conductivity and energy level alignment between the organic materials and the metal cathode. Moreover, the Valence Band level (7.6 eV) of the mixture interface layer is lower than the HOMO (5.4 eV) level of the organic active layer, providing a hole-blocking effect in our device structure. By combining the effect of Ohmic contact and hole-blocking effects, better charge balance and higher device performance can be achieved. Therefore, compared with PLEDs with only a $Cs_2CO_3$ or $TiO_2$ interfacial layer, the mixture layer shows both characteristics of the lower work function and hole-blocking effect from $Cs_2CO_3$ and $TiO_2$, respectively.

Figure 15:
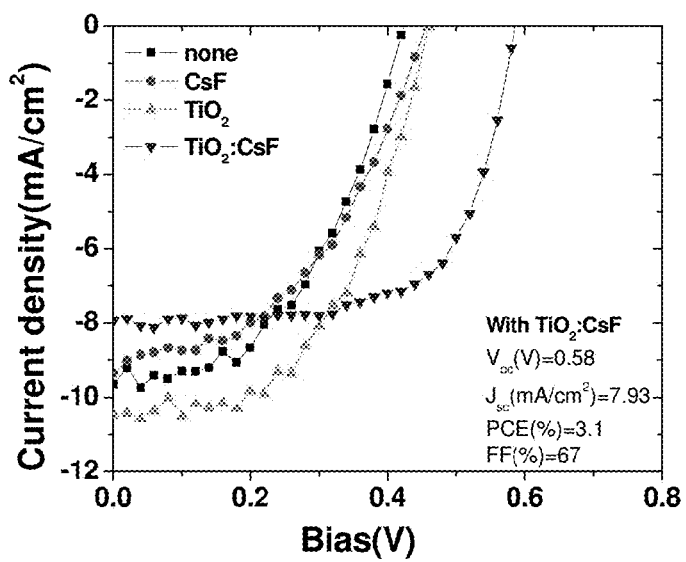
FIG. 15 shows Current Voltage characteristics of a photovoltaic device using a $TiO_2$:CsF interfacial layer.
Figure 16:
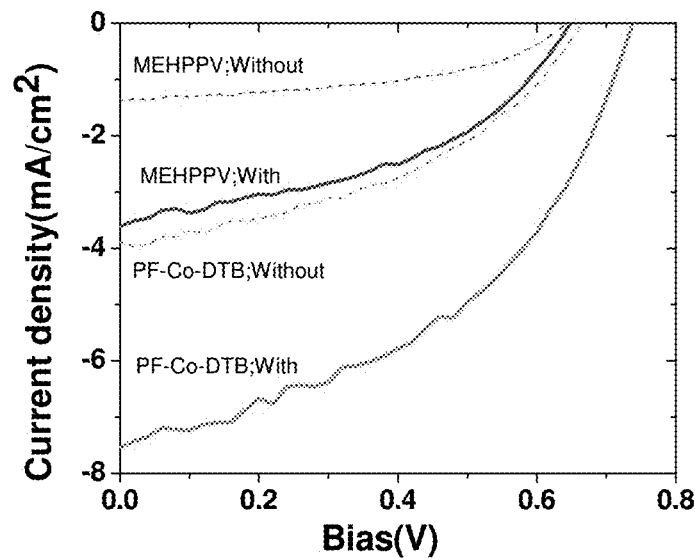
FIG. 16 shows Current-Voltage characteristics of the PF-co-DTB and MEHPPV based photovoltaic device with a $TiO_2$:$Cs_2CO_3$ layer.

A mixture of $TiO_2:Cs_2CO_3$ has been shown to have superior performance in both polymer solar cells and PLEDs. The concept of metal oxide and salt mixture as a functional interfacial layer for organic electronic devices, however, is quite broad. For example, $Cs_2CO_3$ can be expanded to other kinds of carbonate compounds and to other types of salts having a low-work function metal ion in it. As an example, FIG. 15 shows the J-V curves of ITO/PEDOT:PSS/P3HT:PCBM/interfacial layer/Al devices with the interfacial layer being (a) none; (b) CsF; (c) $TiO_2$; and (d) $TiO_2$:CsF blend. Although the photocurrent is reduced, the much improved Voc and FF for the device with a $TiO_2$:CsF interlayer leads to significant improvements in device performance with the PCE of 3.1%, rather than using a single component interfacial layer; 26% compares to $TiO_2$ and 63% to CsF. The exact reason why the device with $TiO_2:Cs_2CO_3$ shows higher current than one with CsF is still an open question. It could be related to the interaction between the two components in the mixture. Further investigation is required to clarify the mechanism. However, the current invention is not limited by the theoretical explanation of the specific mechanism. Combinations of salt and solution processable metal oxides are applicable to other conjugated polymers in addition to P3HT: (e.g. poly{(9,9-dioctylfluorene)-2,7-diyl-alt-[4,7-bis(3-decyloxythien-2-yl)-2,1,3-benzothiadiazole]-5',5'-diyl} (PF-co-DTB), poly [2-methoxy-5-(2'-ethyl-hexyloxy)-1,4-phenylene vinylene] (MEHPPV), poly[2,6-(4,4-bis-(2-ethylhexyl)-4H-cyclopenta[2,1-b;3,4-b']dithiophene)-alt-4,7-(2,1,3-benzothiadiazole)] (PCPDTBT) etc.) according to other embodiments of the current invention. We, indeed, have demonstrated the effectiveness of $TiO_2:Cs_2CO_3$ layers on representative polymer:PCBM solar cell systems (PF-co-DTB & MEHPPV) in FIG. 16. A clear increase in Voc, rectification ratio and especially FF are observed.

We have demonstrated a novel approach for fabricating efficient organic electronic devices by utilizing a mixture of solution processable metal oxides and salts as an interfacial layer. The nano-crystalline $TiO_2$ is synthesized using a non-hydrolitic sol-gel approach and is mixed with a $Cs_2CO_3$ solution. Polymer solar cells based on P3HT:$PC_{70}$BM with a $TiO_2:Cs_2CO_3$ mixture interfacial layer have reached a power conversion efficiency of 4.2% in regular configurations. Significant improvements in PLED performance have also been provided.

Figure 17A:
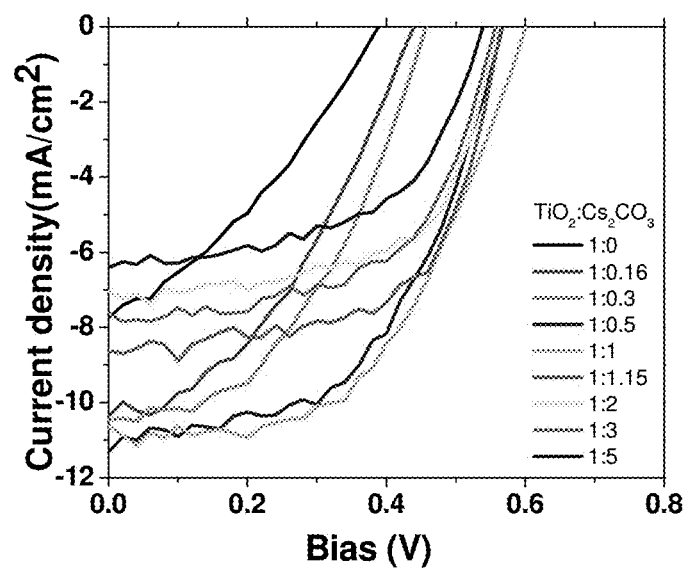
FIGS. 17A and 17B show J-V characteristics of P3HT:$PC_{60}$BM based photovoltaic cells with an evaporated Al cathode and device photovoltaic parameters, respectively, with various $TiO_2$:$Cs_2CO_3$ mixing ratios.
Figure 17B:
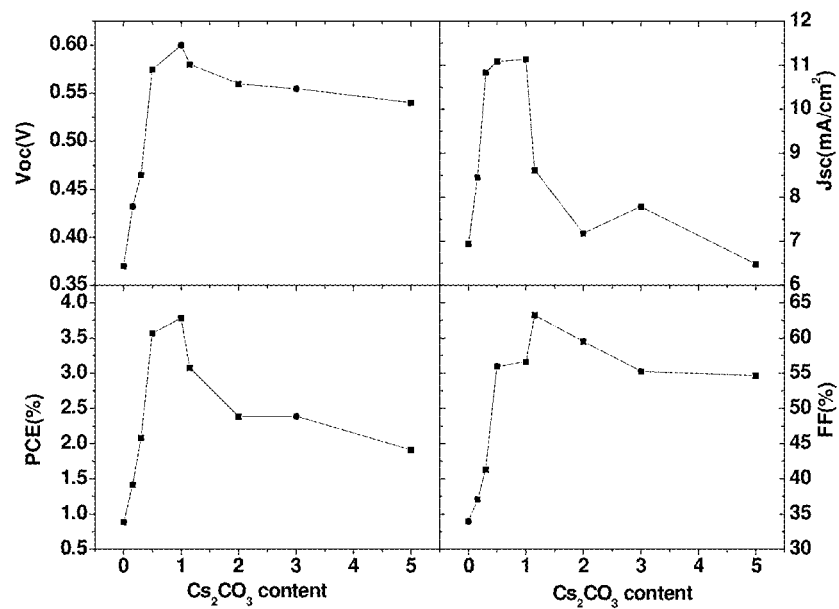

FIG. 17A shows J-V characteristic of a P3HT:PC$_{60}$BM based photovoltaic cell with an evaporated Al cathode for various TiO$_2$:Cs$_2$CO$_3$ mixing ratios. FIG. 17B shows device photovoltaic parameters with various mixing TiO$_2$:Cs$_2$CO$_3$ ratios. According to an embodiment of the current invention, a composition consists essentially of a blend at least one metal oxide and at least one salt in a ratio, by volume, of at least 1:0.1 and less than 1:1.2. According to another embodiment of the current invention, a composition consists essentially of a ratio of metal oxide to salt is about 1:1.

Figure 18:
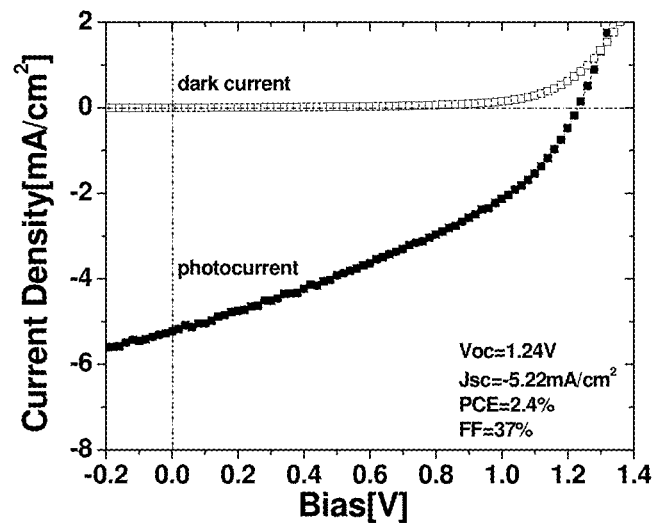
FIG. 18 shows Current density-Voltage characteristics under AM 1.5G conditions and in the dark, indicating that the $TiO_2$:$Cs_2CO_3$:PEDOT layer serves as a good recombination site for both charge carriers.

FIG. 18 shows data for an embodiment of a tandem structure that has been demonstrated as an effective approach to enhance a polymer solar cell performance, especially photo-voltage. One of the key elements in constructing efficient tandem devices is an interconnection unit which has to function as a good charge recombination site and at the same time protect the bottom cell from damage during the film formation process of the top cell. We have demonstrated an embodiment of a tandem cell utilizing a nano-crystalline TiO$_2$:Cs$_2$CO$_3$ n-type interfacial layer, with the active materials being a low band-gap polymer poly[2,6-(4,4-bis-(2-ethyl-hexyl)-4H-cyclopenta[2,1-b;3,4-b']dithiophene)-alt-4,7-(2,1,3-benzothiadiazole)] (PCPDTBT): PCBM and P3HT:PC$_{70}$BM for front and rear cells, respectively. The device structure is as follows:

/ITO/PEDOT/PCPDTBT:PCBM/TiO$_2$:Cs$_2$CO$_3$/PEDOT/P3HT:PC$_{70}$BM/Al.

Current density-Voltage characteristics under AM 1.5G conditions and in the dark is shown in FIG. 18, indicating that the TiO$_2$-Cs$_2$CO$_3$:PEDOT layer serves as a good recombination site for both charge carriers.

The current invention was described with reference to particular embodiments and examples. However, this invention is not limited to only the embodiments and examples described. One of ordinary skill in the art should recognize, based on the teachings herein, that numerous modifications and substitutions can be made without departing from the scope of the invention which is defined by the claims.

We claim:

1. An electro-optic device, comprising:
   a first electrode;
   a second electrode spaced apart from said first electrode;
   an active layer disposed between said first electrode and said second electrode; and
   an interfacial layer in contact with said active layer,
   wherein said interfacial layer comprises a blend of a metal oxide and a salt in a ratio, by volume, of at least 1:0.1 and less than 1:1.2.

2. An electro-optic device according to claim 1, wherein said interfacial layer consists essentially of said blend of said metal oxide and said salt.

3. An electro-optic device according to claim 1, wherein said metal oxide is titanium oxide and said salt is cesium carbonate.

4. An electro-optic device according to claim 2, wherein said metal oxide is titanium oxide and said salt is cesium carbonate.

5. An electro-optic device according to claim 1, wherein said metal oxide consists essentially of metal-oxide nanoparticles.

6. An electro-optic device according to claim 5, wherein said metal-oxide nanoparticles are titanium oxide nanoparticles and said salt is cesium carbonate.

7. An electro-optic device according to claim 2, wherein said metal oxide consists essentially of metal-oxide nanoparticles.

8. An electro-optic device according to claim 7, wherein said metal-oxide nanoparticles are titanium oxide nanoparticles and said salt is cesium carbonate.

9. An electro-optic device according to claim 1, wherein said metal oxide is selected from the group of metal oxides consisting of titanium oxide, zinc oxide, nickel oxide, molybdenum oxide, hafnium oxide, vanadium oxide and any combination thereof.

10. An electro-optic device according to claim 1, wherein said salt is selected from the group of salts consisting of an alkali metal carbonate and an alkali metal fluoride comprising Li, Na, K, Rb, Cs, or combinations thereof.

11. An electro-optic device according to claim 10, wherein said salt is selected from the group of salts consisting of cesium carbonate, cesium fluoride, lithium carbonate, sodium carbonate, potassium carbonate and any combination thereof.

12. An electro-optic device according to claim 1, wherein said active layer is a polymer active layer.

13. An electro-optic device according to claim 1, wherein said first electrode is a transparent electrode,
   wherein said active layer is an active polymer layer, and
   wherein said interfacial layer is arranged on a side of said active layer closer to said second electrode than to said first electrode,
   said electro-optic device being a polymer photo-voltaic device.

14. An electro-optic device according to claim 13, further comprising a hole transport layer arranged between and in contact with said first electrode and said active layer.

15. An electro-optic device according to claim 14, wherein said active layer consists essentially of a blend of poly(3-hexylthiophene) and fullerenes,
   wherein said interfacial layer consists essentially of titanium oxide and cesium carbonate, and
   wherein said hole transport layer consists essentially of PEDOT.

16. An electro-optic device according to claim 1, wherein said first electrode is a transparent electrode, said active layer is an active polymer layer, and
   wherein said interfacial layer is arranged on a side of said active layer closer to said first electrode than to said second electrode,
   said electro-optic device being a polymer inverted photo-voltaic device.

17. An electro-optic device according to claim 16, further comprising a hole buffer layer arranged between and in contact with said second electrode and said active layer.

18. An electro-optic device according to claim 17, wherein said active layer consists essentially of a blend of poly(3-hexylthiophene) and fullerenes,
   wherein said interfacial layer consists essentially of a blend of titanium oxide and cesium carbonate, and
   wherein said hole transport layer consists essentially of vanadium oxide.

19. An electro-optic device according to claim 1, further comprising a second active layer arranged between said first and second electrodes and in contact with said interfacial layer such that said interfacial layer is an intermediate layer between and in contact with the first mentioned active layer and the second active layer.

20. An electro-optic device, comprising:
   a first electrode;
   a second electrode spaced apart from said first electrode;
   an active layer disposed between said first electrode and said second electrode; and
   an interfacial layer in contact with said active layer, wherein said interfacial layer comprises a blend of a metal oxide and a second material that at least one of reduces a work function or increases an electrical conductivity of the interfacial layer, wherein said blend is in a ratio, by volume, of at least 1:0.1 and less than 1:1.2.

21. An electro-optic device according to claim 1, wherein said ratio of said metal oxide to said salt is about 1:1.

22. An electro-optic device according to claim 20, wherein said ratio of said metal oxide to said second material is about 1:1.

23. An electro-optic device according to claim 1, wherein said interfacial layer is a thermally annealed interfacial layer that has been subjected to thermal heat treatment.

24. An electro-optic device according to claim 20, wherein said interfacial layer is a thermally annealed interfacial layer that has been subjected to thermal heat treatment.

\* \* \* \* \*